United States Patent
Kulah et al.

(10) Patent No.: US 10,763,817 B2
(45) Date of Patent: Sep. 1, 2020

(54) CHARACTERIZATION AND DRIVING METHOD BASED ON THE SECOND HARMONIC, WHICH IS ENHANCING THE QUALITY FACTOR AND REDUCING THE FEEDTHROUGH CURRENT IN VARYING GAP ELECTROSTATIC MEMS RESONATORS

(71) Applicant: Haluk Kulah, Ankara (TR)

(72) Inventors: Haluk Kulah, Ankara (TR); Ozge Zorlu, Ankara (TR); Mustafa Kangul, Ankara (TR); Eren Aydin, Ankara (TR); Furkan Gokce, Ankara (TR)

(73) Assignee: Haluk Kulah, Ankara (TR)

( * ) Notice: Subject to any disclaimer, the term of this patent is extended or adjusted under 35 U.S.C. 154(b) by 0 days.

(21) Appl. No.: 16/338,696

(22) PCT Filed: Oct. 12, 2017

(86) PCT No.: PCT/TR2017/050494
§ 371 (c)(1),
(2) Date: Apr. 2, 2019

(87) PCT Pub. No.: WO2019/013719
PCT Pub. Date: Jan. 17, 2019

(65) Prior Publication Data
US 2019/0296711 A1      Sep. 26, 2019

(30) Foreign Application Priority Data
Oct. 20, 2016  (TR) .............................. a 2016 14871

(51) Int. Cl.
*H03H 9/02* (2006.01)
*H03H 9/24* (2006.01)
*H01P 7/00* (2006.01)

(52) U.S. Cl.
CPC ........... *H03H 9/02259* (2013.01); *H01P 7/00* (2013.01); *H03H 9/02433* (2013.01);
(Continued)

(58) Field of Classification Search
CPC .................................. H03H 9/02; H03H 9/24
See application file for complete search history.

(56) References Cited

U.S. PATENT DOCUMENTS 7,982,550 B1 *  7/2011  Quevy .................... H03L 1/022
                                                              331/176
8,094,841 B2 *  1/2012  Trusov ............... G01C 19/5719
                                                              381/174
(Continued)

OTHER PUBLICATIONS

A. T. Lin et al., Enhanced transduction methods for electrostatically driven mems resonators, Measurement Theory & Setup, 2009, 561-564.

(Continued)

*Primary Examiner* — Dean O Takaoka
*Assistant Examiner* — Alan Wong
(74) *Attorney, Agent, or Firm* — Bayramoglu Law Offices LLC

(57) ABSTRACT

A method of an open loop characterization of an electrostatic MEMS based resonator with a varying gap, the method including: converting, via a trans-impedance amplifier circuit, an output current signal of the resonator into a voltage; multiplying the output current signal converted into the voltage, by means of a multiplier circuit, with an AC signal or with a different signal at a frequency of the resonator and carrying a second harmonic signal to a main tone; and measuring a frequency response of a signal cleared of frequencies apart from the main tone using a network analyzer.

2 Claims, 7 Drawing Sheets

(52) U.S. Cl.
CPC . *H03H 9/2405* (2013.01); *H03H 2009/02456* (2013.01); *H03H 2009/02488* (2013.01)

(56) References Cited

U.S. PATENT DOCUMENTS

| | | | |
|---|---|---|---|
| 8,493,157 B2* | 7/2013 | Steeneken | H03D 7/00 |
| | | | 310/365 |
| 8,680,931 B1* | 3/2014 | Pan | H03H 9/02448 |
| | | | 310/313 B |
| 9,431,955 B1* | 8/2016 | Northcutt | H03B 5/04 |
| 2003/0052742 A1 | 3/2003 | Niu et al. | |
| 2007/0091971 A1 | 4/2007 | Tanaka | |
| 2010/0283353 A1 | 11/2010 | Van Der Avoort | |
| 2012/0068776 A1 | 3/2012 | Asamura et al. | |
| 2013/0113533 A1* | 5/2013 | Aaltonen | H03L 7/235 |
| | | | 327/147 |

OTHER PUBLICATIONS

S. A. Bhave et al, Fully-differential poly-SiC Lame mode resonator and checkerboard filter, in 18th IEEE International Conference on Micro Electro Mechanical Systems, 2005, 223-226.

J. E. Y. Lee et al, Parasitic feedthrough cancellation techniques for 25 enhanced electrical characterization of electrostatic microresonators, Sensors Actuators, A: Physical, 2009, 36-42, vol. 156, No. 1.

Mustafa Kangül, MEMS based resonant mass sensors with feedthrough current elimination for in-liquid cell detection applications, Middle East Technical University, 2015.

* cited by examiner

CHARACTERIZATION AND DRIVING METHOD BASED ON THE SECOND HARMONIC, WHICH IS ENHANCING THE QUALITY FACTOR AND REDUCING THE FEEDTHROUGH CURRENT IN VARYING GAP ELECTROSTATIC MEMS RESONATORS

CROSS REFERENCE TO THE RELATED APPLICATIONS

This application is the national phase entry of International Application No. PCT/TR2017/050494, filed on 12 Oct. 2017, which is based upon and claims priority to Turkish Patent Application No. 2016/14871, filed on 20 Oct. 2016, the entire contents of which are incorporated herein by reference.

TECHNICAL FIELD

The invention subject to the application is related to a new, feedthrough-current-eliminating and high-quality-factor characterization method for electrostatically driven varying gap resonators. The invention makes use of the second harmonic term of the current at the output electrode of the resonators. By using this method, not only the signal-to-feedthrough current ratio but also the quality factor of the system can be increased. This method is suitable to be used for all electrostatically driven resonators with varying gap.

BACKGROUND

MEMS resonators are used in many military, biomedical and various end user applications. Accelerometers and gyroscopes, thermometers, and mass sensors with nanogram sensitivity are the most known applications that make use of resonator structures. In all of these applications, detection of the resonance frequency is crucially important. Moreover, when the quality factor is high, the small changes in resonance frequency are perceived more easily and the phase noise during close circuit oscillation gets lower.

MEMS resonators can simply be modeled with a spring, a mass and a damper (FIG. 1). When this system is actuated (driven) by a force, it moves. Maximum movement is observed when the actuation frequency is equal to the resonance frequency. In FIG. 2, a varying gap electrostatic MEMS resonator is illustrated. A typical electrostatic resonator comprises a drive electrode, a sense electrode and a DC polarization electrode.

If the movable proof mass that is polarized with DC voltage is actuated with AC drive voltage, it starts moving with the effect of electrostatic force (Electrostatic Drive). The gap changes because of the movement, leading to capacitance change that causes the generation of AC current at the sensing electrode. This current is defined as the output current.

The maximum output current is observed when the input voltage frequency is equal to the mechanical resonance frequency. The forces that are formed in varying gap resonators comprise different harmonic elements; however, the effect of higher harmonic components are not reflected into movement due to the band-pass structure of the resonator. As the relationship between the capacitance change and the change in the gap during the conversion of the motion into a current is not linear, the output current comprises other harmonic elements apart from drive frequency (main tone).

In the other studies in the literature, other harmonic elements in the output current have been neglected and only main tone has been used for the characterization of a resonator. However, the parasitic capacitance between the drive electrode and the sensing electrode (and the parasitic resistance formed in some cases) leads to the observation of parasitic currents in the main tone. The parasitic currents, that are also called feedthrough currents, may be limiting in some cases during the characterization of electrostatic MEMS resonators. Especially in applications requiring stiffer springs, as the voltage-current gain is reduced, the output current is dominated by the feedthrough current. For example in real-time measurements carried out in liquid mediums (fluid, gas etc.), the damping effect of the liquid(s) reduces the output whereas the fault currents may be more dominant.

While performing resonance characterization of a typical resonator, first, a frequency sweep is carried out when the electrostatic resonator is active. Following this, the DC bias of the resonator is turned off and another frequency sweep is carried out again at the same frequency ranges. The results of both characterizations can be subtracted from each other in a computer environment and the real resonance characteristics can be obtained. However, this method does not enable real-time characterization.

In order to enable real time resonance characterization, the feedthrough current should be eliminated from the system. Moreover, the closed loop oscillation is not possible without eliminating feedthrough current. To eliminate the feedthrough current, various methods have been proposed in the literature. In the first method, an active and a passive resonator are used. The passive and active resonators are driven with 180° phase different signals and thereby out-of-phase feedthrough currents are generated. When these currents are added at the sense electrode, ideally the feedthrough currents are eliminated. However, it is not possible to provide ideal elimination conditions. First, the phase difference between the generated signals needs to be exactly 180°. Moreover, the multiplication of the signal amplitudes and parasitic capacitances of the signals need to be as close to each other. When the two conditions are not completely satisfied, the feedthrough current cannot be completely eliminated. Another elimination method is a method where resonators with differential output currents are used. In this method, two out-of-phase currents of the same resonator is differentiated and mutual parasitic currents are eliminated. In the case that parasitic capacitances are mismatched, the signals obtained from the two outputs need to be multiplied by different gains and then they are subtracted from each other. If the gains of the signals are not properly adjusted, the feedthrough current cannot be completely eliminated. In addition, the differential method brings about an extra (application specific) resonator design cost.

The quality factor (Q) is an important parameter for accomplishing real time resonance characterization using the present methods based on the main tone signal. The high quality factor means that the gain at the resonance frequency is higher than gains in other frequencies. This makes it easier to detect the resonance frequency during open circuit resonance characterization and for closed loop oscillation. Especially the quality factors of resonators that operate in a fluid medium (liquid or gas) can be low because of the suppression of the output current by parasitic feedthrough currents due to the damping effect. In such applications, it may not always be possible to accomplish real time resonance characterization by using the present methods. Moreover, the quality factors of silicon MEMS resonators that operate under vacuum is limited by the quantum limit of silicon. According to this, There is a maximum value of the frequency-quality factor multiplication of the system (Q*f).

When the present applications of the known state of the art are taken into consideration, it can be seen that there exist no application having the same features of the proposed second harmonic reading based characterization/drive method that reduces the feedthrough current and increases the quality factor in electrostatic MEMS resonators. The reduction of the quality factor in high damping coefficient mediums and the repression of the resonator current due to the feedthrough current can be compensated by means of this invention.

SUMMARY

The present invention is related to a characterization/drive method based on a second harmonic reading that reduces feedthrough current and increases the quality factor in electrostatic MEMS resonators in order to eliminate the above mentioned disadvantages and to provide new advantages to the state of the art.

The aim of the invention is to eliminate capacitive (and resistive) feedthrough currents and to increase the quality factor at the same time, by accomplishing resonance characterization using a second harmonic output current.

Another aim of the invention is to ease the resonance characterization with a new method, which both solves the problem created by the feedthrough currents and increases the quality factor.

Another aim of the invention is to provide a method where any kind of varying gap electrostatically driven/read resonator is sufficient to eliminate the feedthrough current.

Another aim of the invention is to provide a method that can increase the quality factor without changing the resonance frequency.

Another aim of the invention is to increase the Q*f multiplication in MEMS resonators above quantum limits.

BRIEF DESCRIPTION OF THE DRAWINGS

Below, the figures that have been prepared to further describe the characterization/drive method based on a second harmonic reading that reduces feedthrough current and increases the quality factor in electrostatic MEMS resonators that has been developed by means of this invention are described.

DETAILED DESCRIPTION OF THE EMBODIMENTS

In this detailed description, the novelty provided by the invention is described with non-limiting examples which should not be deemed to limit the scope of the invention but which are rather used to further explain the invention. The characterization/drive method, operation, its aspects and aims based on a second harmonic reading, which reduces feedthrough current and increases the quality factor in electrostatic MEMS resonators (1) is described below in detail.

The parts in the figures have each been numbered and the references of each number has been listed below.

Figure 1:
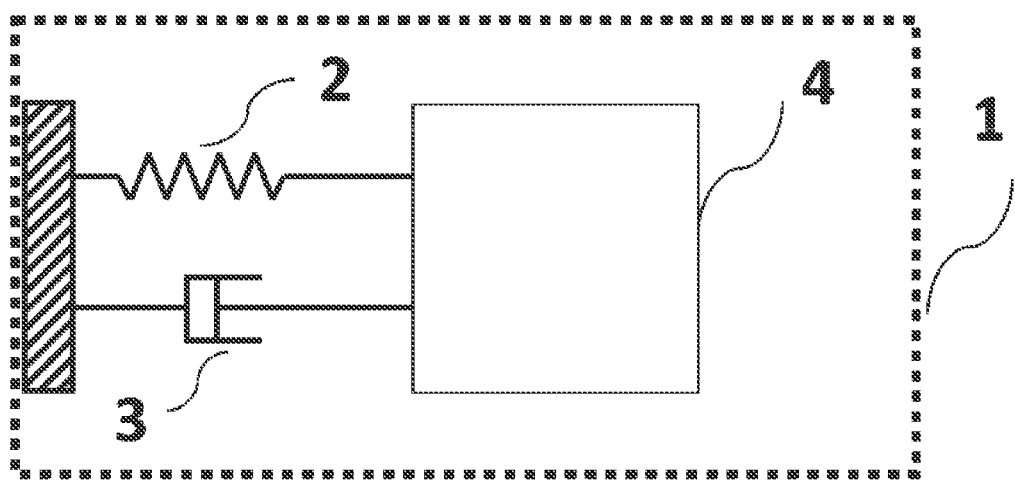
FIG. 1 shows a mechanical model of a resonator.
Figure 2:
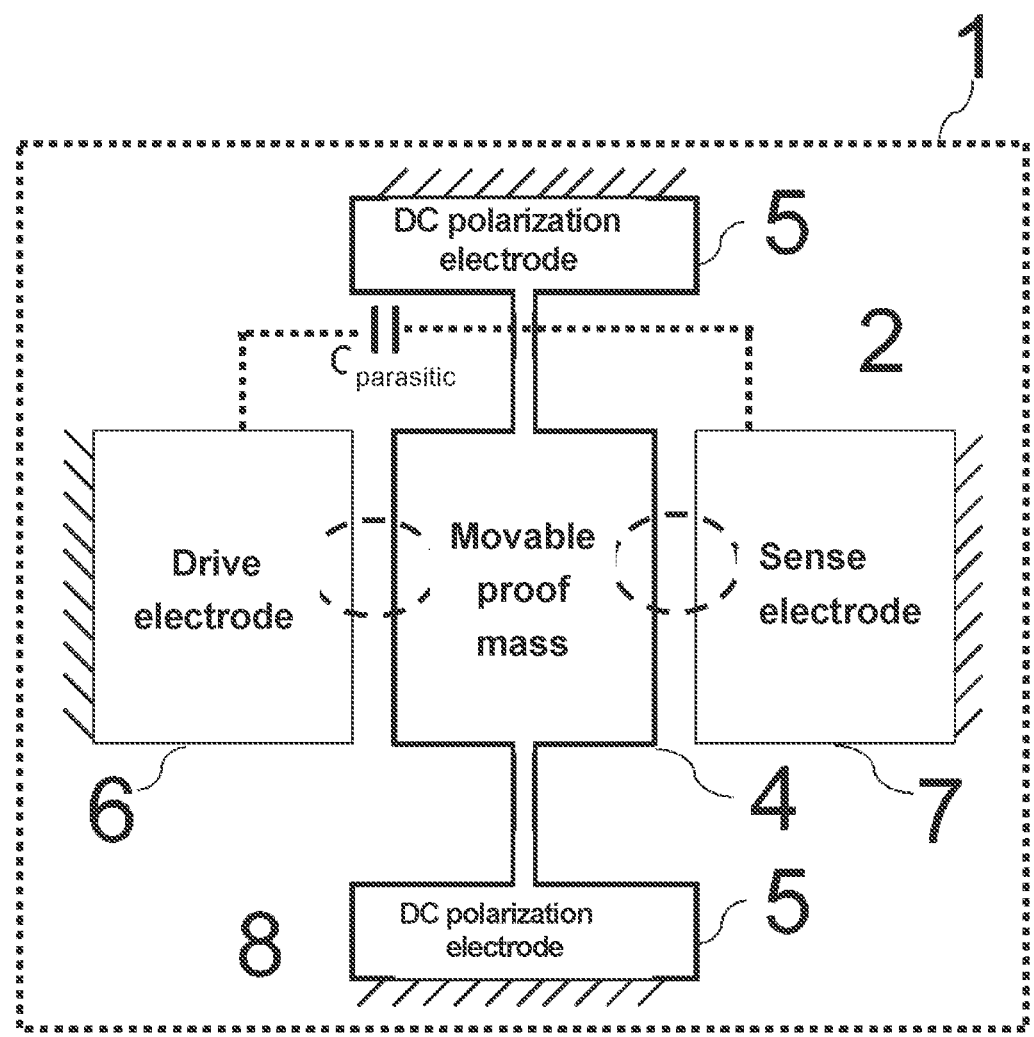
FIG. 2 shows a schematic view of the electrostatic varying gap MEMS resonator.

1. Resonator
2. Spring, (k)
3. Damping, (B)
4. Moveable proof mass, (m)
5. DC polarization electrode
6. Drive electrode
7. Sense electrode
8. Varying gaps
9. Trans-impedance amplifier
10. Mixer
11. Network analyzer
12. High harmonic elimination circuit
13. Phase and gain regulation amplifier Electrostatic varying gap MEMS based resonator structures (1) are used as transducers, which convert input voltage into output current. In FIG. 1, the mechanical modeling of a typical resonator has been shown and in FIG. 2, the diagram of the electrostatic varying gap MEMS based resonator structure has been shown. The AC voltage applied to the input electrode (6) causes generation of an electrostatic force by means of the DC voltage applied from the DC polarization electrode (5) to the moveable proof mass (4). The gap (8) of the capacitor located between the sense electrode (7) and the moveable proof mass (4) which starts moving by means of this force is changed and this in turn leads to the generation of an electric current. The forces generated in varying gap resonators (1) also comprise other harmonic elements; however, by means of the bandpass structure of the resonator, the effect of higher harmonic elements will not influence motion. As the relationship between the change of the capacitance and the change of gap during the conversion of motion into current is nonlinear, the output current comprises other harmonic components besides drive frequency (main tone).

Two new methods have been proposed within the scope of the invention, which are "the open loop characterization method of electrostatic variable spacing MEMS based resonator structures" and "the closed loop driving method of electrostatic variable spacing MEMS based resonator structures".

Figure 3:
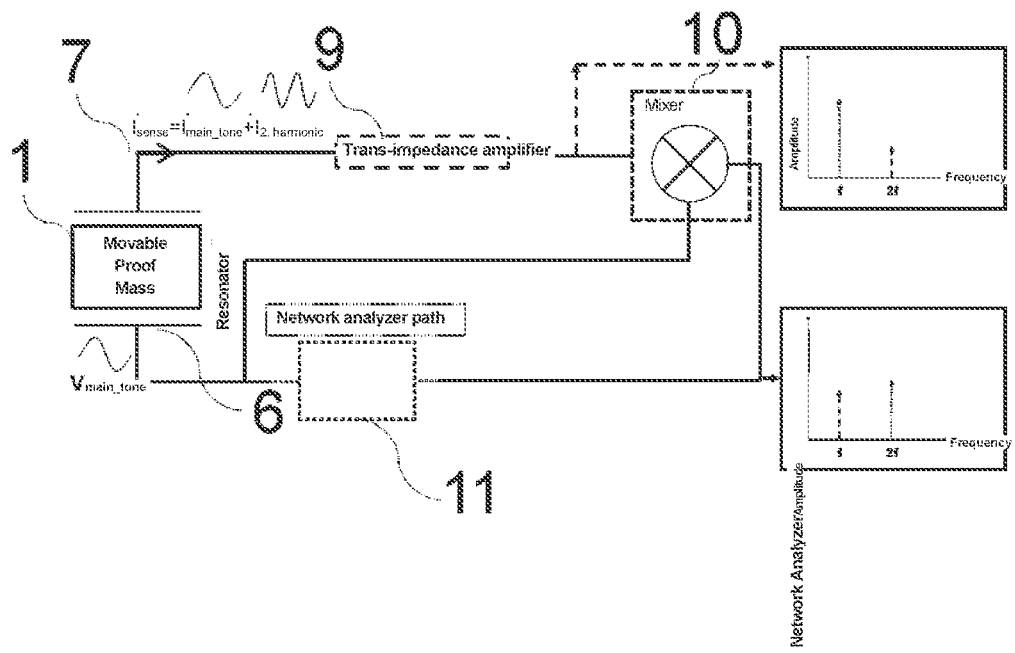
FIG. 3 shows a diagram showing the open loop characterization of the electrostatic varying gap MEMS based resonator structures.

In the open loop characterization method of electrostatic varying gap MEMS resonator structures (FIG. 3), the second harmonic component of the output current is used for resonator characterization. The output current is converted into voltage using a trans-impedance amplifier (9).

The output voltage obtained is multiplied with another signal having the same frequency or with the input signal using a mixer (10). Following this multiplication, the main tone is transferred to DC and 2nd harmonic frequencies, and the 2nd harmonic tone is transferred to the main tone and 3rd harmonic frequencies. By this means, the second harmonic component in the output current can be examined at the main tone frequency.

As the capacitive (or resistive) feedthrough current is formed on drive voltage due to the parasitic capacitance, it is at the same frequency with the main tone. This method converts the second harmonic component, which comprises less parasitic current of the output current into main tone, and the main tone output of the resonator, which carries the feedthrough current is conveyed to other harmonics and therefore these are eliminated.

Figure 4:
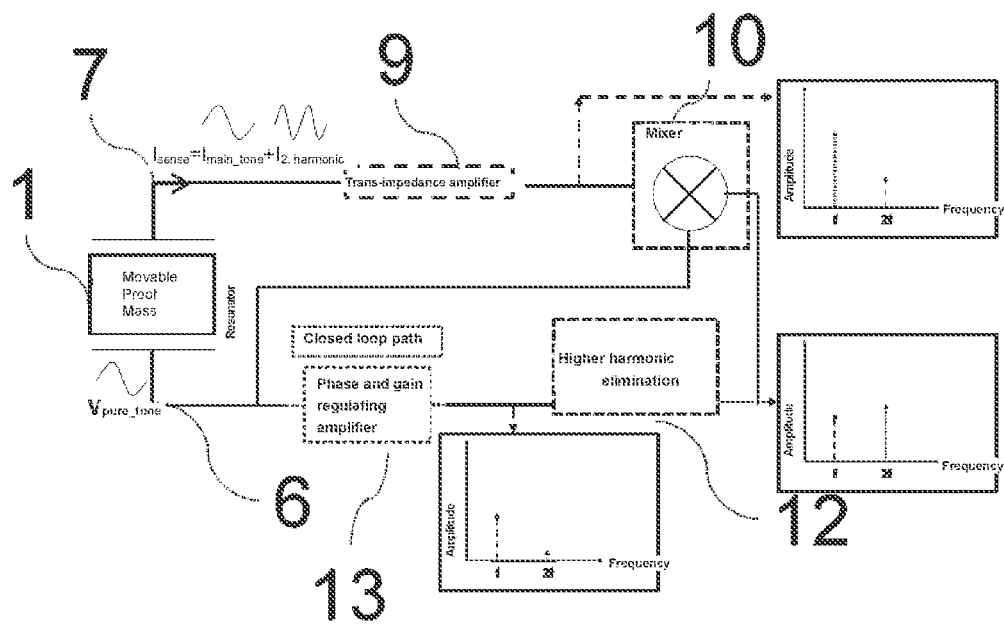
FIG. 4 shows a diagram showing the closed loop operation of electrostatic varying gap MEMS based resonator structures.

The closed loop driving method of electrostatic variable spacing MEMS based resonator structures (FIG. 4) enables the resonator structures to self-oscillate. Closed loop driving is another method, which enables to reach resonance frequency. In this method the voltage at the output of the mixer (10) (output signal) is filtered with a higher harmonic elimination circuit (12), and the frequencies beside the resonance frequency (main tone) of the signal are also eliminated. It is required for the gain of the system at resonance frequency to be at least 1 and the phase response to be zero by means of the amplifier circuits (13) that regulate phase and gain, in order to meet the Barkhausen criteria. After this condition is provided, the system continues to oscillate at the resonance frequency. The resonance frequency of the system can be detected by tracking the signal that drives the resonator with a frequency meter.

The functions of the electronic circuit components used in the application of the two new methods have been described below.

Trans-impedance amplifier is an electronic circuit, which converts by means of a feedback resistance the input current into output voltage. The voltage/current gain is determined by resistance values.

The mixer (e.g. voltage mixer), is an electronic circuit, which multiplies the two input signals. This is used in order to multiply the AC voltage or another signal having the same frequency that is used to drive the resonator with the output voltage of the current voltage converter.

The network analyzer is a device that is used in order to determine the open loop characteristic of the system. The output voltage of the network analyzer is applied to the open loop input of the system, the open loop output of the system, is connected to the network analyzer input. The network analyzer applies voltages at the desired frequencies and the desired magnitudes and the device obtains the magnitude and phase response of the system by checking the phase and the magnitude in accordance with the voltage applied to the system output voltage. By this means in resonance systems, the device provides resonance frequency and quality factor information.

The higher harmonic elimination circuit eliminates the high frequency components of the input signal using various methods. The most frequently used method is filter structures; however, it is possible to design special circuits for each application.

Figure 5:
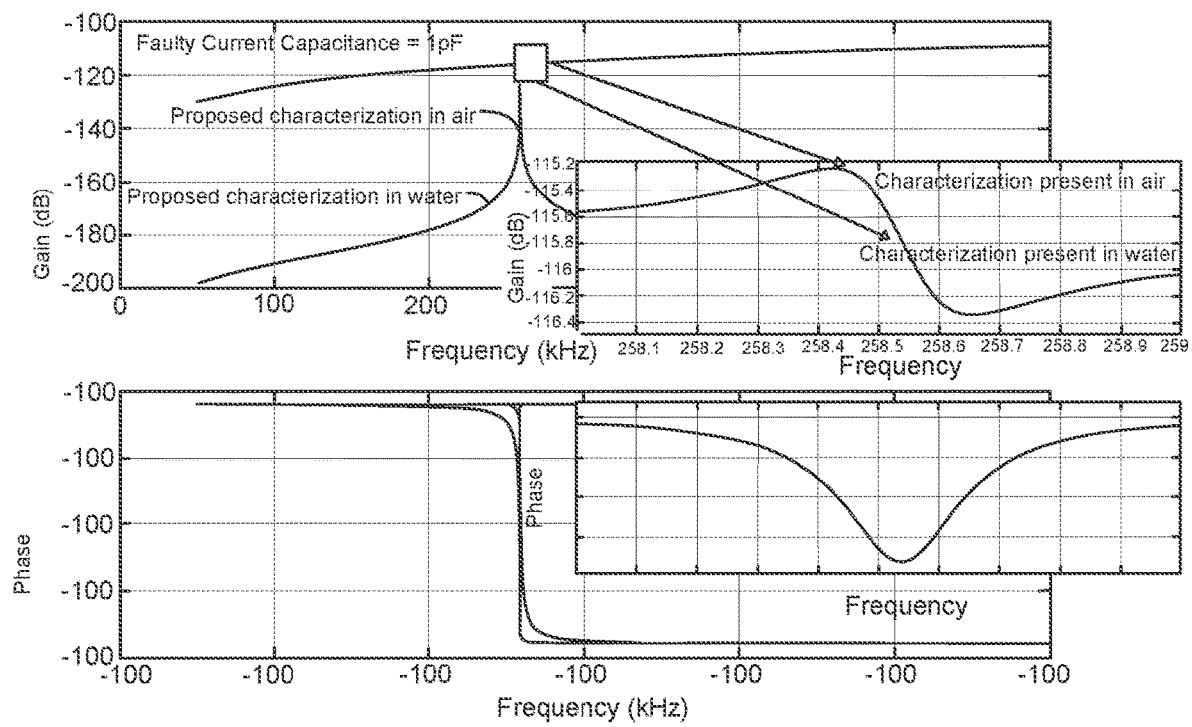
FIG. 5 shows effect of the capacitive feedthrough currents to the proposed and present characterization methods.

As can be seen in FIG. 5, the dominant feedthrough current in the present characterization method corrupts the resonance characteristics; however, with the proposed method, the resonance characteristics in high damping coefficient mediums such as air and water can be obtained.

Figure 6:
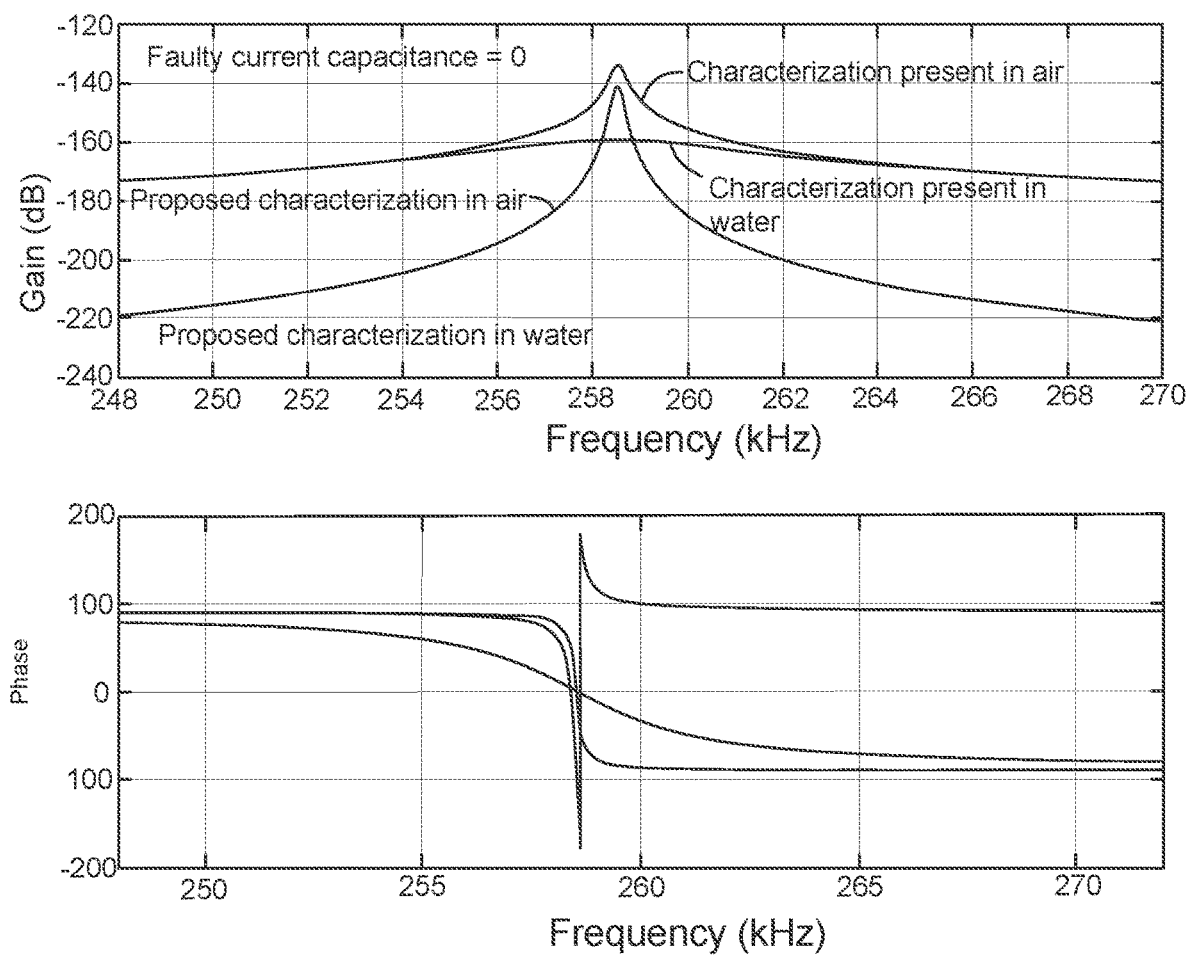
FIG. 6 shows resonance simulation results carried out in air and water medium using the present and proposed characterization methods.

As it can be seen in FIG. 6, the simulations carried out in water and air mediums according to the proposed method, provides higher resonance peaks when compared with the quality factors obtained from the present system.

Figure 7:
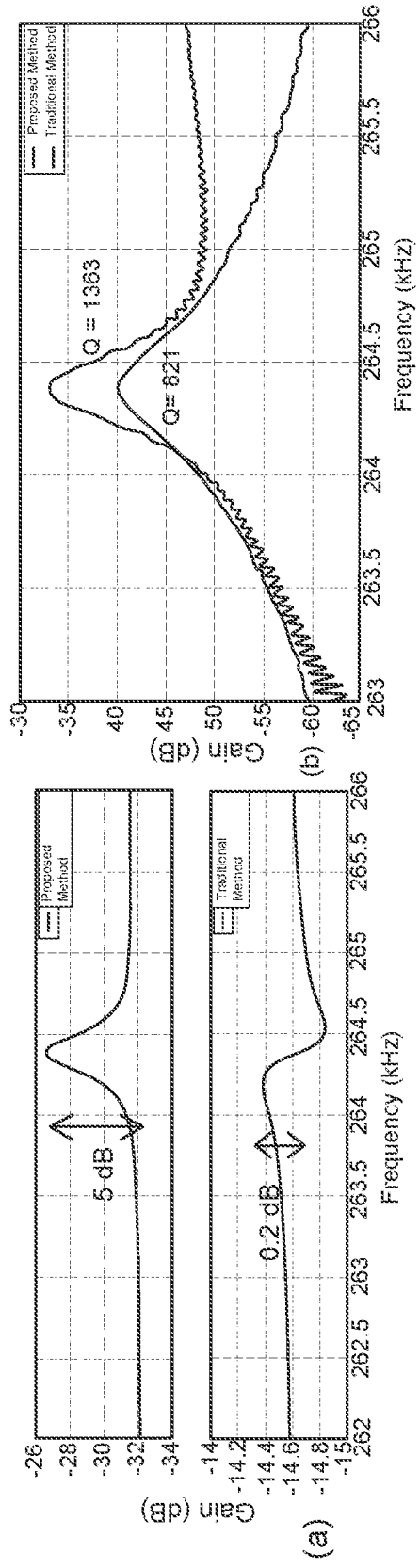
FIG. 7 shows resonance measurements carried out with the traditional method and our method: The information that has not been processed (a) is shown and the information relating to the fault currents obtained by means of a computer (b) is shown.

In FIG. 7A and FIG. 7B, the characteristics, which we have observed by testing the same resonator, has been given. In FIG. 7A, reduction in the feedthrough current has been shown. In the characterization carried out with the traditional method, 0.2 dB resonance peak has been obtained; however, when our novel method is used, the magnitude of this peak has been increased to 6 dB. When the quality factor measurement is carried out, as it can be seen in FIG. 7B, the quality factor that was calculated to be 821 when the traditional method was used has increased to 1363 when our method was used. These results also show that compliance with the simulations is obtained.

What is claimed is:

1. A method of an open loop characterization of an electrostatic MEMS based resonator with a varying gap, the method comprising:
   converting, via a trans-impedance amplifier circuit, an output current signal of the resonator into a voltage;
   multiplying the output current signal converted into the voltage, by means of a multiplier circuit, with an AC signal or with a different signal at a frequency of the resonator and carrying a second harmonic signal to a main tone; and
   measuring a frequency response of a signal cleared of frequencies apart from the main tone using a network analyzer.

2. A method for closed loop operation (drive) of an electrostatic MEMS based resonator with a varying gap, the method comprising:
   converting an output current signal of the resonator into a voltage via a trans-impedance amplifier circuit;
   multiplying the output current signal converted into the voltage, by means of a multiplier circuit, with an AC signal or with a different signal at a frequency of the resonator and obtaining a second harmonic signal to a main tone;
   eliminating frequencies apart from the main tone of the resonator of the multiplied signal with a frequency eliminator circuit to form a clear signal;
   adjusting gain and phase values of the clear signal by using an amplifier to form an amplified signal; and
   feeding back the amplified signal to a resonator drive electrode.

* * * * *